(12) United States Patent
Kasuta

(10) Patent No.: US 7,221,594 B2
(45) Date of Patent: May 22, 2007

(54) SEMICONDUCTOR DEVICE AND METHOD FOR WRITING DATA INTO SEMICONDUCTOR DEVICE

(75) Inventor: Yoshinori Kasuta, Aizuwakamatsu (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/193,872

(22) Filed: Jul. 29, 2005

(65) Prior Publication Data

US 2006/0023501 A1 Feb. 2, 2006

Related U.S. Application Data

(63) Continuation of application No. PCT/JP2004/010913, filed on Jul. 30, 2004.

(51) Int. Cl.
*G11C 11/34* (2006.01)
*G11C 7/02* (2006.01)

(52) U.S. Cl. .............. 365/185.2; 365/185.21; 365/185.22; 365/210

(58) Field of Classification Search .......... 365/185.18, 365/185.2, 185.21, 195.22, 185.29, 185.33, 365/210

See application file for complete search history.

(56) References Cited

U.S. PATENT DOCUMENTS

| | | | | |
|---|---|---|---|---|
| 5,142,495 A * | 8/1992 | Canepa | ..................... | 365/185.2 |
| 5,699,295 A * | 12/1997 | Yero | ..................... | 365/185.21 |
| 5,708,602 A | 1/1998 | Yamada | ..................... | 365/185 |
| 6,091,640 A | 7/2000 | Kawahara et al. | .......... | 365/185 |
| 6,118,691 A * | 9/2000 | Kalnitsky et al. | ....... | 365/185.18 |
| 6,134,148 A | 10/2000 | Kawahara et al. | .......... | 365/185 |
| 6,163,485 A | 12/2000 | Kawahara et al. | .......... | 365/185 |
| 6,272,051 B1 | 8/2001 | Choi | ......................... | 365/185 |
| 6,285,597 B2 | 9/2001 | Kawahara et al. | .......... | 365/185 |
| 6,459,621 B1 | 10/2002 | Kawahara et al. | .......... | 365/185 |
| 6,496,418 B2 | 12/2002 | Kawahara et al. | .......... | 365/185 |
| 6,594,181 B1 * | 7/2003 | Yamada | .................. | 365/185.21 |
| 6,700,819 B2 * | 3/2004 | Pascucci | ................ | 365/185.21 |
| 2004/0008543 A1 | 1/2004 | Kato | ......................... | 365/189 |

FOREIGN PATENT DOCUMENTS

| JP | 6-68682 | 3/1994 |
|---|---|---|
| JP | 9-282895 | 10/1997 |
| JP | 10-106276 | 4/1998 |
| JP | 2000-195281 | 7/2000 |
| JP | 2004-39184 | 2/2004 |

* cited by examiner

*Primary Examiner*—Trong Phan

(57) ABSTRACT

A semiconductor device includes an array of memory cells, a reference circuit determining a reference level by using a reference cell, and a comparator circuit comparing data of the memory cells with the reference level, and the reference circuit comprising a circuit part that is connected to the reference cell and shifts the reference level. The circuit part includes a diode connected to a source of the reference cell and a switch transistor that is connected in parallel with the diode and is turned on/off. It is therefore possible to realize multiple threshold voltages with the use of one transistor for the reference cell, by shifting the threshold voltage of the reference cell.

8 Claims, 18 Drawing Sheets

TRIMMING WITH NO1 = H

TRIMMING WITH NO1 = L

CONVENTIONAL
FIG. 8B
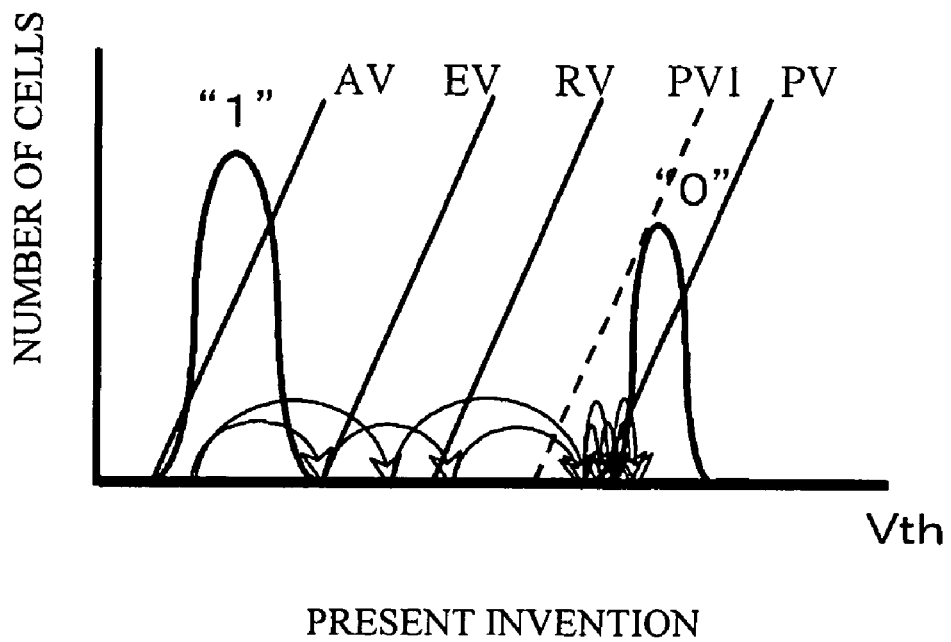
PRESENT INVENTION

FIG. 9A
CONVENTIONAL
PROGRAM
OPERATION
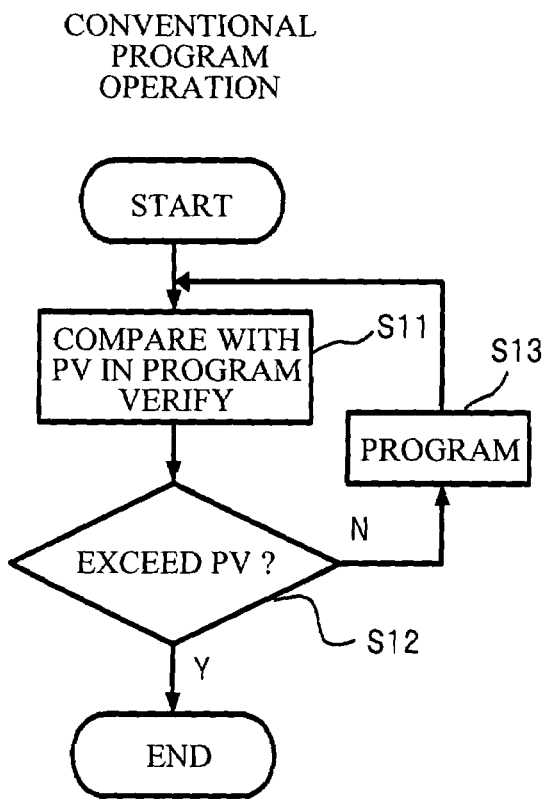
PROGRAM OPERATION
OF PRESENT
INVENTION

CONVENTIONAL REFERENCE CIRCUIT

134 MOS DIODE

REFERENCE CIRCUIT OF THE PRESENT INVENTION

SEMICONDUCTOR DEVICE AND METHOD FOR WRITING DATA INTO SEMICONDUCTOR DEVICE

CROSS REFERENCE TO RELATED APPLICATIONS

This is a continuation of International Application No. PCT/JP2004/010913, filed Jul. 30, 2004.

BACKGROUND OF THE INVENTION

1. Field of the Invention

This invention generally relates to semiconductors and methods for writing data into the semiconductor device, and more particularly, to a semiconductor device having multiple reference levels and a method for writing the data into the aforementioned semiconductor device.

2. Description of the Related Art

The semiconductor memories are categorized into volatile ones that lose the information therein and non-volatile ones that retain the information therein, when the power turns off. Flash memories, in which the rewriting time is shortened by erasing the data at one time, are well known as a representative of the non-volatile ones.

This type of flash memory includes reference cells such as a reference cell for read, another reference cell for program, another reference cell for erase, another reference cell for convergence, and the like. Generally, each device has only one reference cell level in each of the reference cells.

FIGS. 1A and 1B are views illustrating data determination of the memory cell. In FIG. 1A, a Vg-Id characteristic curve 40 shows the characteristics of the reference cell transistor. A Vg-Id characteristic curve 41 shows the characteristic of the memory cell transistor that is erased, that is, the characteristic of the memory cell transistor that stores data of 1. A Vg-Id characteristic curve 42 shows the characteristic of the memory cell transistor that is programmed, that is, the characteristic of the memory cell transistor that stores data of 0. As shown in FIG. 1A, the same voltage is applied to the gates of the memory cell and the reference cell on the flash memory. For example, at the time of reading, if the current value that flows through the memory cell is higher than that flows through the reference cell, the data is determined as "1". If the current value that flows through the memory cell is smaller than that flows through the reference cell, the data is determined as "0". As will be seen in FIG. 1A, current Iread is greater than current Izero and less than current Ione.

However, the flash memory stores or does not store an electron in the floating gate to control a threshold value Vth of the memory cell transistor, and it is determined the current volume that is passed by applying arbitrary gate voltage. In this type of flash memory, the threshold value Vth of the memory cell that stores an electron may be lowered over time after releasing the electron, as the rewriting time into the memory increases, for example. In contrast, the reference cell in which the rewriting operation is not performed has a constant reference level, which is the threshold value.

As shown in FIG. 1B, the Vg-Id characteristic curve 42 is shifted to the left to be something like a Vg-Id characteristic curve 43, and a current Izero that is to be flown through the memory cell flows more than a current Iread, although the current Izero is originally smaller than the current Iread. This causes a problem in that the data of the memory cell is considered as the data "1", although the data has to be determined as "0", leading to a defect in some cases. It is necessary to determine whether the device is good or bad at a reference level Vth higher than the reference level for read in order to sense and recover the defect before the memory cell is detected as defective at the time of parity check or the like and the device operation is stopped.

However, in the aforementioned case, a different reference level circuit has to be provided in addition to the reference level that is normally used, causing a problem in that the area is increased. There arises another problem in that a trimming time is increased for adjusting the levels by providing multiple reference circuits.

SUMMARY OF THE INVENTION

The present invention has an object of providing a semiconductor device and a writing method that solves the above-mentioned problems in the conventional techniques and that has multiple reference levels in an area as small as possible.

In order to solve the above-mentioned problems, according to an aspect of the present invention, preferably, there is provided a semiconductor device including an array of memory cells, a reference circuit determining a reference level by using a reference cell, and a comparator circuit comparing data of the memory cells with the reference level. The reference circuit includes a circuit part that is connected to the reference cell and shifts the reference level. It is therefore possible to provide multiple reference levels with one reference cell, by shifting the reference cell. This makes it possible to reduce the areas of the semiconductor device. Moreover, the trimming period can be shortened by reducing the number of the reference cells.

On the above-mentioned semiconductor device, the circuit part may include a diode connected to a source of the reference cell. The reference level output from the reference circuit may be equal to the threshold value added by the voltage drop of the diode.

On the above-mentioned semiconductor device, the circuit part may include a switch transistor that is connected in parallel with the diode and is turned on/off. The diode can be selectively connected to the reference cell, by turning the switch transistor on and off, enabling shifting the reference level.

The above-mentioned semiconductor device may further include a control circuit that controls the switch transistor.

On the above-mentioned semiconductor device, the control circuit may perform a verify operation on the memory cells by using reference levels produced by turning the switch transistor on/off.

The above-mentioned semiconductor device may further include a write circuit that writes data into the memory cells, wherein the write circuit uses different writing levels before and after the reference level is shifted. For example, programming is performed in a large unit until the first reference level is exceeded, and programming is performed in a small unit from the first reference level to the second one. This makes it possible to make the program potential sharp in a short period of time.

On the above-mentioned semiconductor device, the control circuit may check levels of the memory cells using reference levels obtained by turning the switch transistor on/off. It is therefore possible to find the abnormal cell in an initial stage.

On the above-mentioned semiconductor device, the control circuit may check the levels of he memory cells using reference levels obtained by turning the switch transistor on/off when the semiconductor device is activated.

According to another aspect of the present invention, preferably, there is provided a method of writing data in a memory cell comprising the steps of changing a reference level by controlling an on/off operation on a transistor connected in parallel with a circuit having a reference cell and a diode connected in series; and writing data into the memory cell with different reference levels before and after the reference level is changed. This makes it possible to make the potential of the programming voltage sharp.

According to the present invention, the semiconductor device and the programming method can be provided in such a manner that the trimming period is short and multiple reference levels are provided in a smaller area.

BRIEF DESCRIPTION OF THE DRAWINGS

FIGS. 8A and 8B are views showing the reference levels of the reference circuits;

FIGS. 9A and 9B are flowcharts showing program verify operations;

DESCRIPTION OF THE PREFERRED EMBODIMENTS

A description will now be given, with reference to the accompanying drawings, of embodiments of the present invention.

First Embodiment

Figure 2:
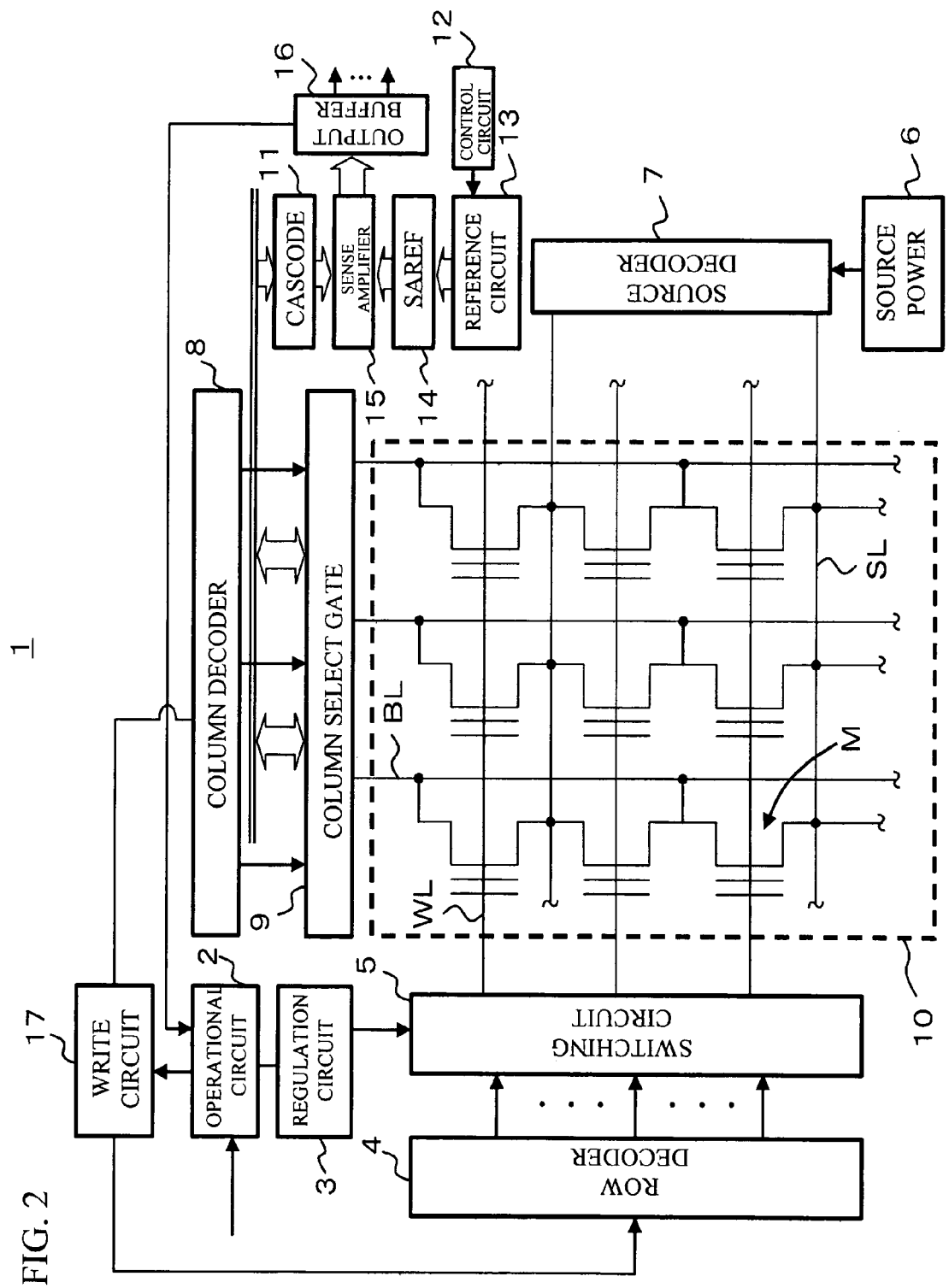
FIG. 2 is a block diagram of the semiconductor device in accordance with a first embodiment.

A description will be given of a semiconductor device in accordance with a first embodiment. FIG. 2 is a block diagram of the semiconductor device. Referring to FIG. 2, a semiconductor device 1 includes an operational circuit 2, a regulation circuit 3, a row decoder 4, a switching circuit 5, a source power 6, a source decoder 7, a column decoder 8, a column select gate 9, a memory cell array 10, a cascode circuit 11, a control circuit 12, a reference circuit 13, a cascode circuit for reference (SAREF) 14, a sense amplifier (comparator) 15, an output buffer 16, and a write circuit 17. The semiconductor device 1 may be a single semiconductor device such as a packaged flash memory, or may be incorporated into the semiconductor device as a part thereof such as a system LSI.

The memory cell array 10 includes a non-volatile memory cell M that stores data including a control gate connected to a word line WL, a drain connected to a bit line BL, a source connected to a source line SL, and a floating gate. Multiple non-volatile memory cells M are arranged in a matrix. The operational circuit 2 internally including a command register decodes a command supplied from the outside, reads into the memory cell M, and controls various internal circuits in order to perform the operations such as write into the memory cell M, erase, read, and the like.

The regulation circuit 3 adjusts the power supply voltage VCC to a given level and generates a bit line voltage to supply to the switching circuit 5. The row decoder 4 decodes the address supplied from an address buffer (not shown). The switching circuit 5 activates the word line WL of the memory cell according to the decoded result. The power is supplied to the source decoder 7 from the source power 6, and the source line SL is selected. The column decoder 8 decodes the address supplied from the address buffer (not shown).

The column select gate 9 selectively connects the bit line BL of the memory cell array 10, on the basis of the decoded address signal. This establishes a read/write path of the data to the memory cell array 10. The cascode circuit 11 converts a current Id flowing through the memory cell into a voltage signal to supply to the sense amplifier 15. The control circuit 12 applies the gate voltage to the reference cell.

The reference circuit 13 includes a reference cell (transistor) to which the gate voltage is applied and a circuit portion that shifts the reference level of the reference cell. This reference cell is used as various reference cells such as the reference cell for read, the reference cell for program, the reference cell for erase, and the reference cell for convergence, as will be described later in detail. The cascode circuit 14 for reference converts the current Id flowing through the reference cell into a voltage signal to supply to the sense amplifier 15.

The sense amplifier 15 compares the data of the memory cell with the data of the reference cell by way of the cascode circuit 11, judges whether the data in the memory cell is 0 or 1, reads the judgment result as read-out data, and supplies the read-out data to the output buffer 16. The write circuit 17 drives the row decoder 4 and the column decoder 8 under the control of the operational circuit 2, and performs the write operation of the data into the memory cell M.

The verify operation performed together with the program operation and erase operation is performed by comparing the current of the data supplied from the memory cell M designated by the row decoder 4 and the column decoder 8 with the reference currents indicated by the reference cell for program verify operation and the reference cell indicated by the erase verify operation.

Figure 3:
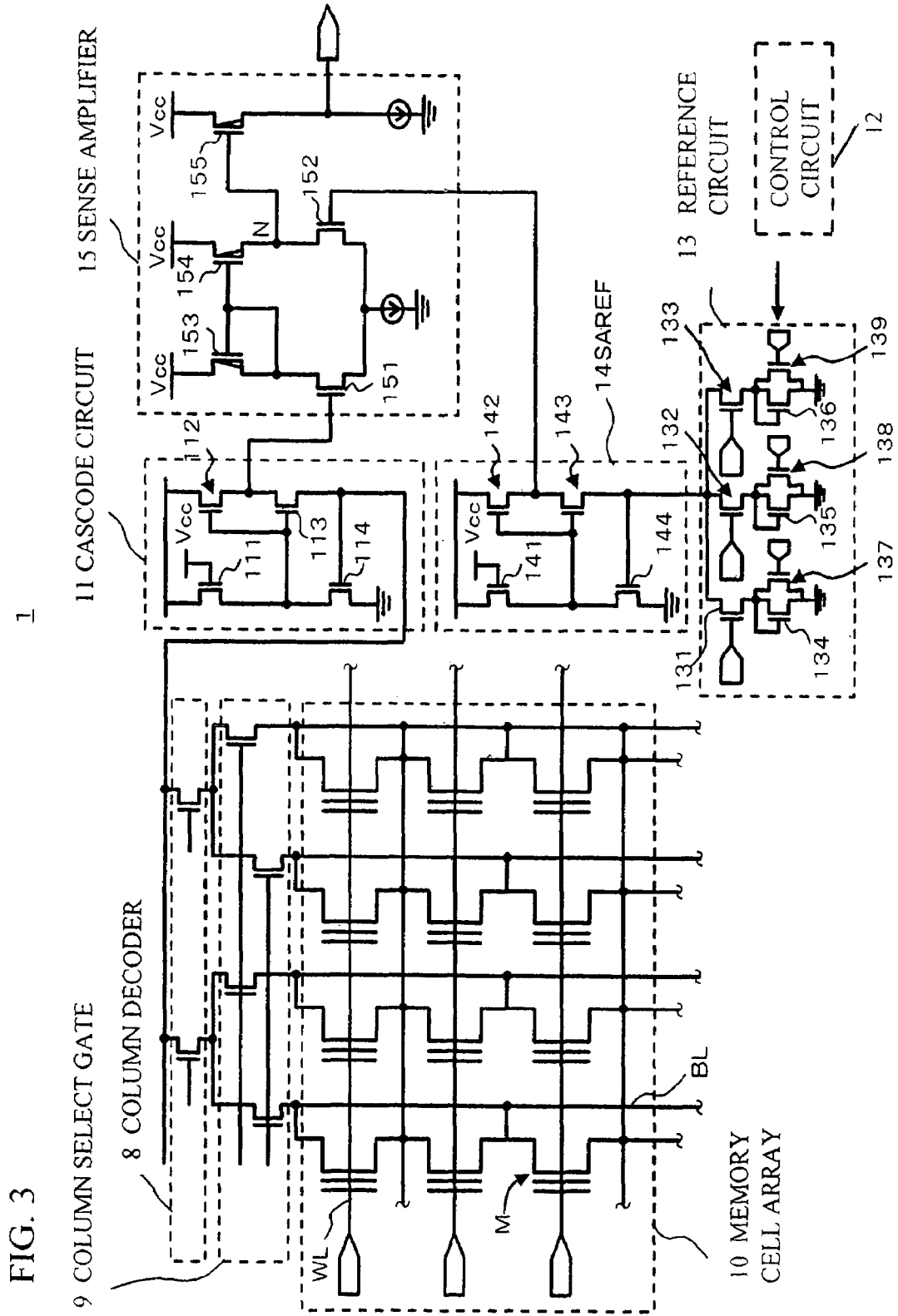
FIG. 3 is a circuit diagram showing a configuration of a reference cell and a sensing path.

Next, a description will be given of the reference cell and the sensing path in detail. FIG. 3 is a circuit diagram showing a configuration of the reference cell and the sensing path. Referring to FIG. 3, the semiconductor memory device 1 includes the column decoder 8, the column select gate 9, the memory cell array 10, the cascode circuit 11, the control circuit 12, the reference circuit 13, the cascode circuit for reference (SAREF) 14, and the sense amplifier 15. The memory cell array 10 includes the non-volatile memory cell M that stores data including the control gate connected by the word line WL, the drain connected by the bit line BL, the source connected by the source line SL, and the floating gate. Multiple non-volatile memory cells M are arranged in a matrix.

The column decoder 8 selects a select transistor according to the decoded result of the address supplied from the address buffer. The column select gate 9 turns on and off to selectively connect the bit line BL of the memory cell array 10. This establishes the read/write path to the memory cell array 10. The cascode circuit 11 includes multiple transistors 111 through 114 to convert the current Id flowing through the memory cell into the voltage signal.

The reference circuit 13 includes three transistors 131 through 133 that compose the reference cell. MOS diodes 134 through 136 and transistors 137 through 139 are respectively provided for the transistors 131 through 133. FIG. 3 shows an example in which the reference circuit 13 includes three transistors, yet any number of the transistors may be provided for the reference cell. The cascode circuit 14 for reference includes multiple transistors 141 through 144 in order to convert the current Id flowing through the transistors 131 through 133 into the voltage signal.

The sense amplifier 15 includes a differential amplifier circuit composed of transistors 151 through 154 and an amplifier circuit composed of a transistor 155. The differential amplifier circuit amplifies the difference between the voltage applied to the gate of the transistor 151 and the voltage applied to the gate of the transistor 152, and the amplified voltage signal is applied to the gate of the transistor 155 of the amplifier circuit from a node N. The cascode circuit 11 is connected to the gate of the transistor 151, and the cascode circuit 14 for the reference cell is connected to the gate of the transistor 152. The sense amplifier 15 supplies the amplified voltage signal to the output buffer 16 as the read-out data.

Figure 4:
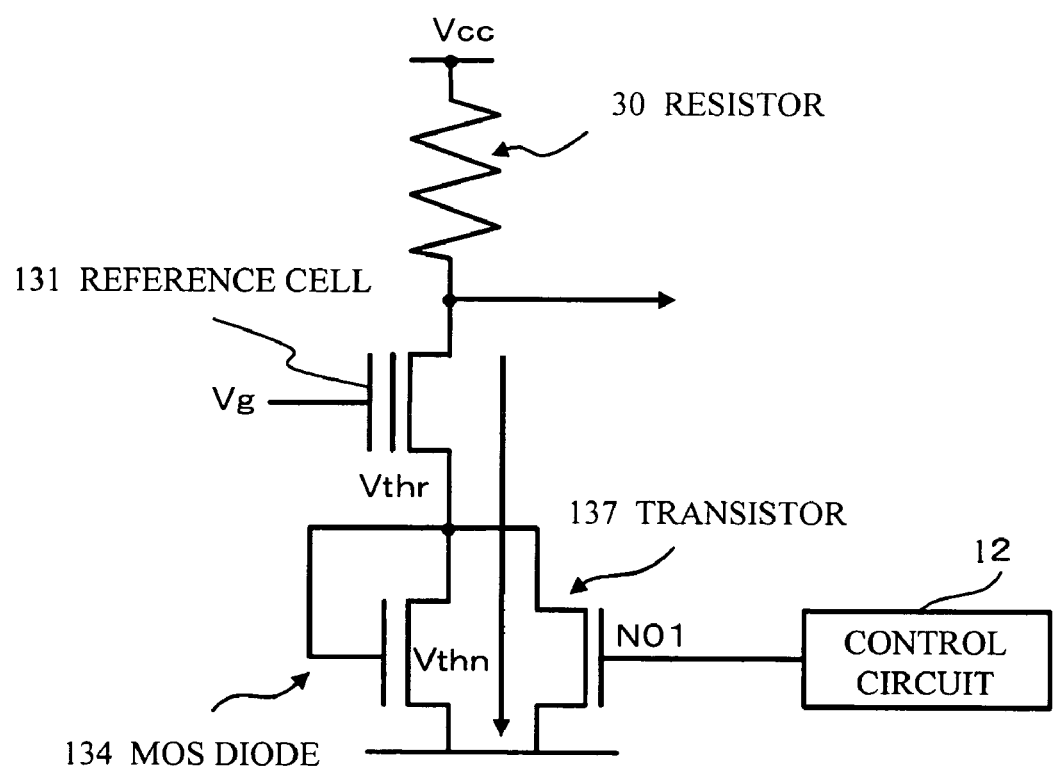
FIG. 4 is a circuit diagram of a configuration of a reference circuit.

Next, a description will be given of the reference circuit 13 that has been described with FIG. 3 in detail. FIG. 4 is a circuit diagram of a configuration of the reference circuit. One of the reference cell included in the reference circuit 13 shown in FIG. 3 is enlarged in FIG. 4. As shown in FIG. 4, the reference circuit 13 includes the reference cell transistor 131, the MOS diode 134, the transistor 137, and the resistor 30.

The transistor 131 is a floating gate type of transistor. The MOS diode 134 is composed, for example, of an N-type transistor, and is directly connected to the source of the transistor 131. The transistor 137 is a transistor for bypass, and is connected in parallel with the MOS diode 134. The transistor 137 is composed of an N-channel transistor. The gate voltage of the transistor 137 is controlled by the control circuit 12. The transistor 137 composes a circuit that shifts the reference level generated by the reference circuit 13. By controlling on and off of the transistor 137, the MOS diode 134 can be bypassed. This makes it possible to generate the reference level higher than the transistor 131 Vthr by Vthn or lower by Vthn.

Figure 5:
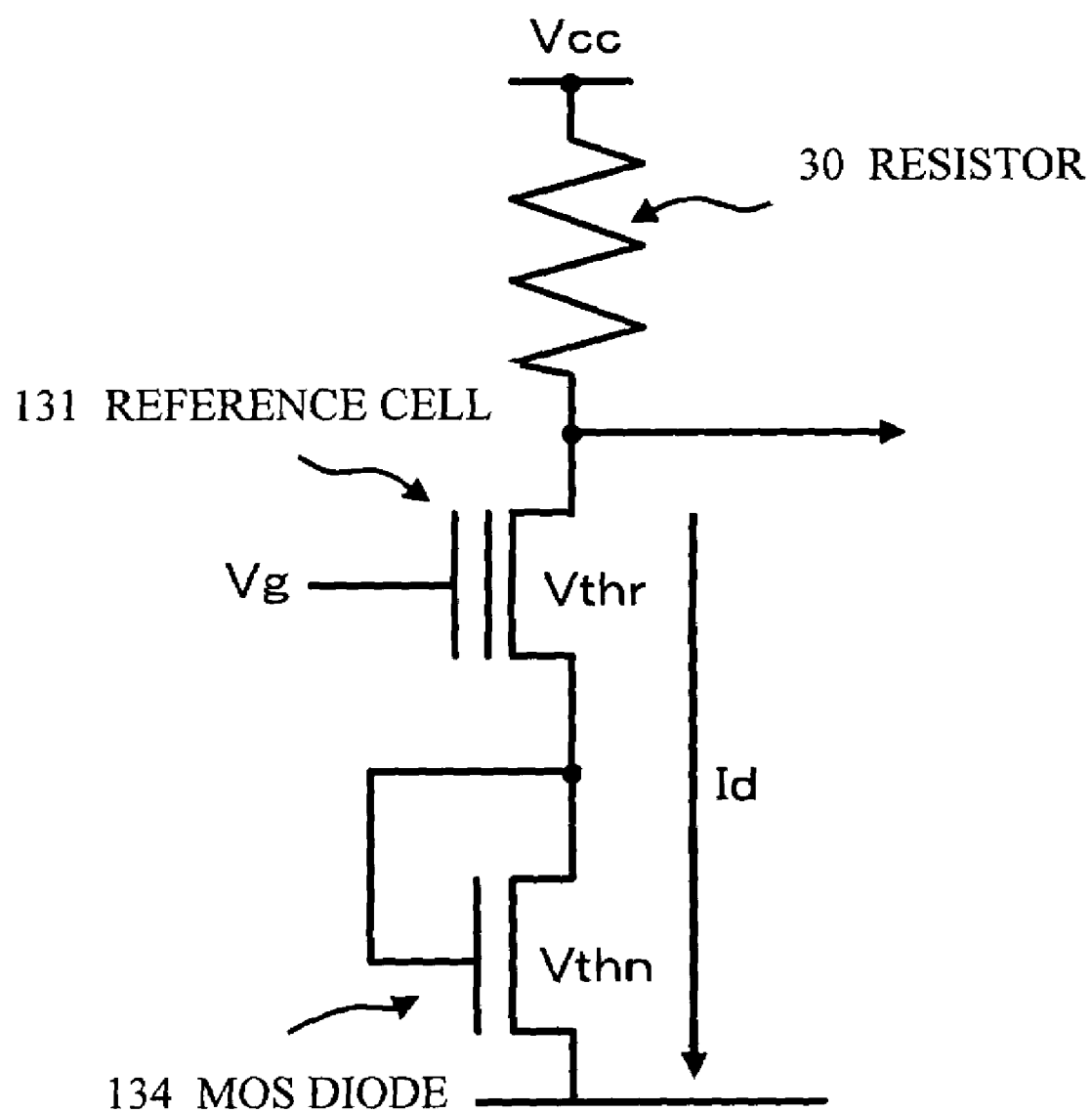
FIG. 5 is a circuit diagram showing a configuration of the reference circuit in which a transistor for bypass is removed.

Next, a description will be given of an action. FIG. 5 is a circuit diagram showing a configuration of the reference circuit in which the transistor 137 for bypass is removed from that shown in FIG. 5. As shown in FIG. 5, the MOS diode 134 of the N-type transistor is connected to the source of the transistor 131 in the reference circuit 13. Reference numeral 30 denotes a resistor. A gate voltage Vg is applied to the gate of the transistor 131. At this time, the current flowing across the reference cell 131 is set to Id.

Figure 6:
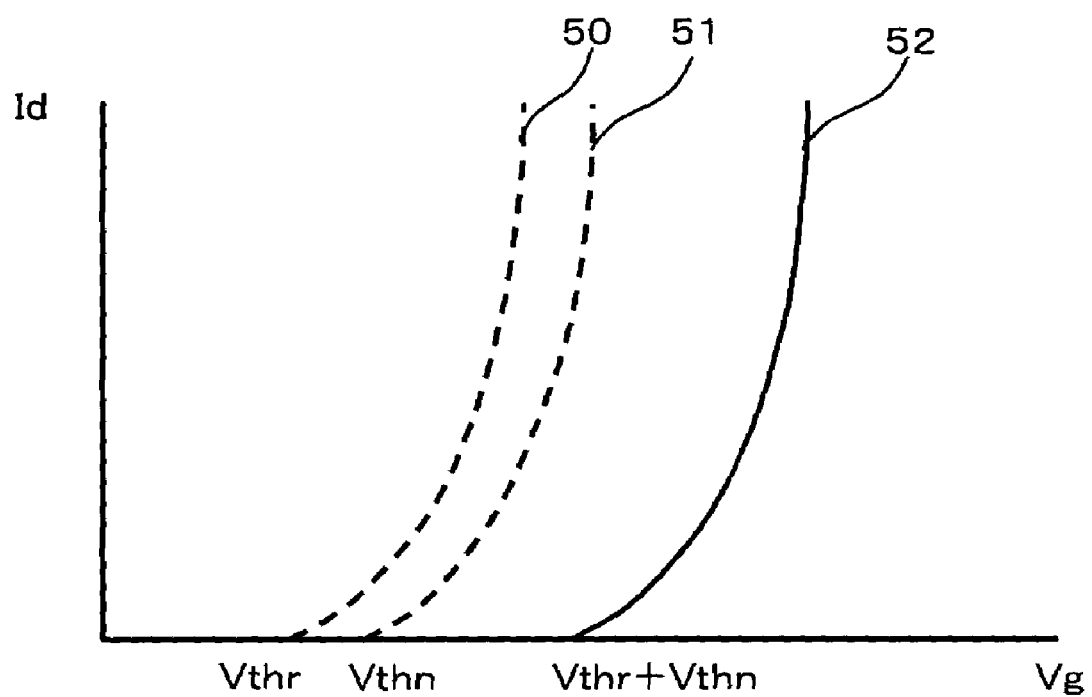
FIG. 6 is a view showing Vg-Id characteristics of the relationship between a gate voltage Vg and a drain current Id in the reference cell.

FIG. 6 is a view showing Vg-Id characteristics of the relationship between the gate voltage Vg and the drain current Id in the transistor 131. In FIG. 6, a Vg-Id characteristic curve 50 denotes the Vg-Id characteristic of the transistor 131. Another Vg-Id characteristic curve 51 denotes the Vg-Id characteristic of the N-type transistor of the MOS diode 134. Further another Vg-Id characteristic curve 52 denotes the Vg-Id characteristic shifted to higher than the threshold value by Vthn by connecting the N-type transistor of the MOS diode 134 to the source of the transistor 131 by V thn. In this manner, by connecting the N-type transistor of the MOS diode 134 to the source of the transistor 131, it is possible to generate the reference level higher than the threshold value Vth by Vthn.

Figure 7A:
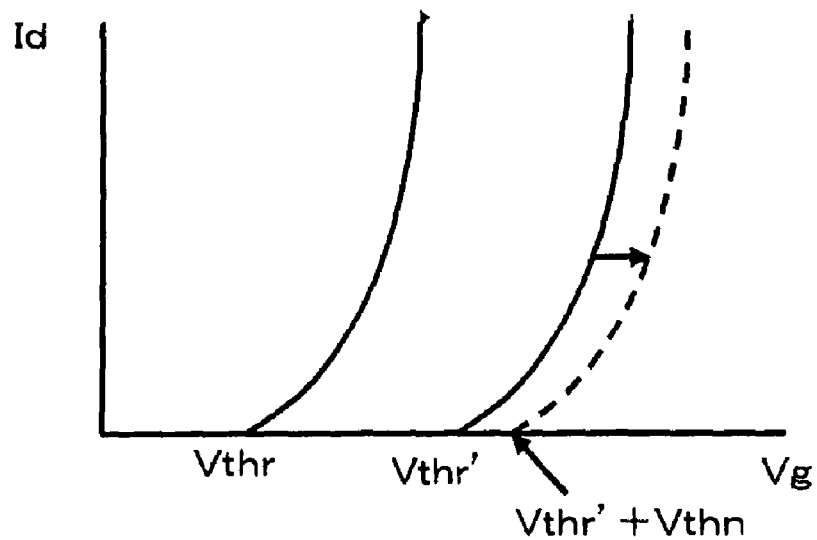
FIG. 7A shows the drain current Id when a node N01 of the transistor 137 is changed from a high level to a low level.
Figure 7B:
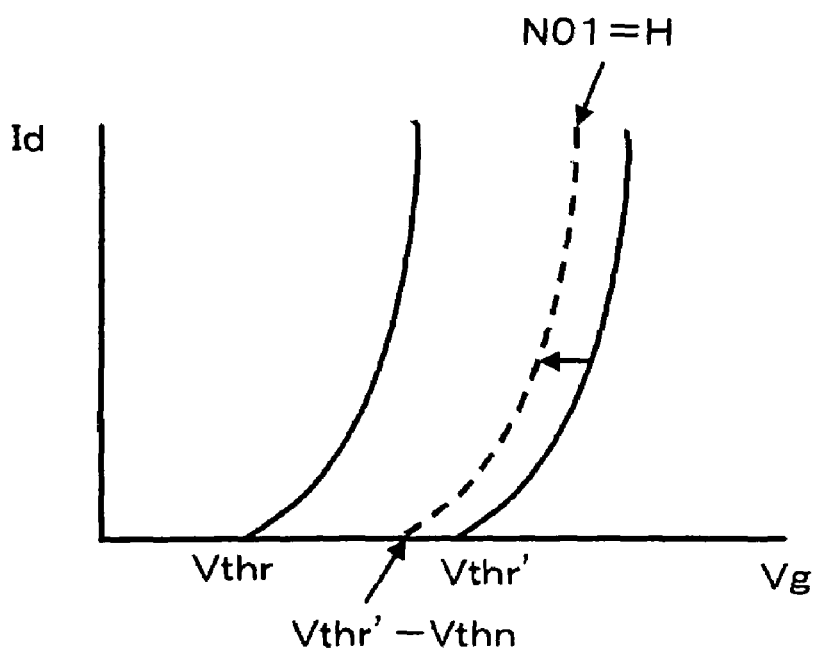
FIG. 7B shows the drain current Id when the node N01 of the transistor 137 is changed from the low level to the high level

FIG. 7A shows the drain current Id when a node N01 of the transistor 137 is changed from a high level (TRIMMING WITH N01=H) to a low level. FIG. 7B shows the drain current Id when the node N01 of the transistor 137 is changed from the low level (TRIMMING WITH N01=L) to the high level. As shown in FIG. 7A, the reference level generated by the reference circuit 13 is increased from Vthr to Vthr' (=Vthr+Vthn) in any gate voltage Vg, by changing the transistor 137 into an off state from an on state. As shown in FIG. 7B, the reference level generated by the reference circuit 13 is decreased from Vthr' to Vthr (=Vthr−Vthn) in any gate voltage Vg, by changing the transistor 137 into the on state from the off state. It is therefore possible to generate different reference levels by adjusting the gate voltage Vg, and at the same time, the reference level can be always changed by turning the transistor 137 on and off.

In accordance with the present embodiment, there are provided the MOS diode 134 and the transistor 137 that bypasses the MOS diode 134. Shifting in the reference level can be controlled by shifting the reference level by Vth of the MOS diode 134 and by controlling on/off of the transistor 137 for bypass. That is, this makes it possible to produce the reference level higher than the reference level by Vth or that lower by Vth. Therefore, only one transistor for reference cell enables multiple threshold values, resulting in that the area of the semiconductor device can be reduced. Also, the number of the reference circuits can be reduced, enabling to shorten a trimming time for adjusting the level.

Second Embodiment

Figure 8A:
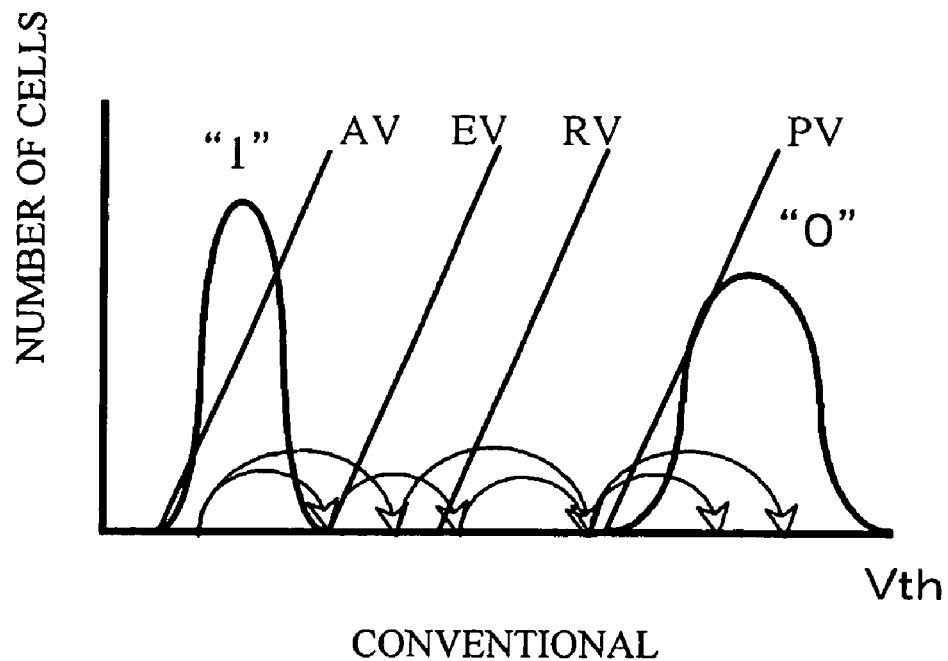

Next, a description will be given of a second embodiment. In the second embodiment, a description will be given of an example in which the reference circuit 13, which has been described in the first embodiment, is applied for verify operation. FIG. 8A is a view showing the threshold value of the conventional reference cell. FIG. 8B is a view showing the threshold value of the present invention. In the aforementioned figures, the horizontal axis denotes the threshold value Vth, and the vertical axis denotes the number of cells.

"1" denotes a potential distribution of the memory cell in the erase state, and "0" denotes the potential distribution of the memory cell in the write state.

In FIG. 8A, AV denotes the threshold value of the reference cell used for convergence (self-convergence), EV denotes the threshold value of the reference cell used for erase verify operation, RV denotes the threshold value of the reference cell for read, and PV denotes the threshold value of the reference cell used for program verify operation. In FIG. 8B, PV1 denotes the threshold value of the reference cell used for program verify operation (a first threshold value), and PV denotes the threshold value of the reference cell used for program verify operation (a second threshold value).

As described in the first embodiment, the MOS transistor 134 is connected to the source of the transistor 131, and the transistor 137 is connected in parallel with the MOS transistor 134. By turning on and off the transistor 137 to shift the reference level, the first threshold value PV1 and the second threshold value PV are available for the program verify operation.

Figure 9B:
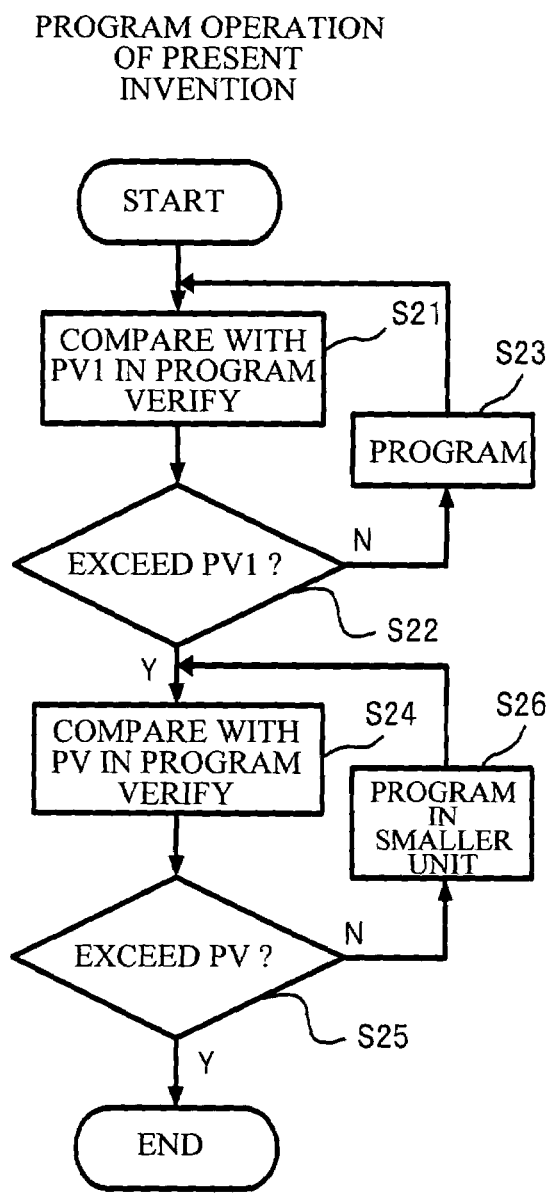

Next, a description will be given of the program verify operation. FIG. 9A is a flowchart showing the conventional program verify operation. FIG. 9B is a flowchart of the program verify operation in accordance with the present invention. FIG. 9A corresponds to FIG. 8A, and FIG. 9B corresponds to FIG. 8B.

As shown in FIG. 9A, the level of the memory cell designated by the row decoder and the column decoder is compared with the threshold value PV in the sense amplifier 15, in step S11. If the control circuit 2 determines that the level of the memory cell exceeds the threshold value PV in step S12, complete the program verify operation. On the other hand, if the control circuit 2 determines that the level of the memory cell does not exceed the threshold value PV in step S12, drive the row decoder 4 and the column decoder 8 in the write circuit 17 and execute the program operation on the memory cell, in step S13.

In this manner, conventionally, one type of reference voltage is used for program verify operation. Therefore, when the level of the memory cell exceeds the threshold value PV, the level of the memory cell is judged to have reached the program level. It took time to perform programming little by little to make the voltage distribution for programming sharp.

Next, a description will be given of the program verify operation in accordance with the present invention. The control circuit 2 performs the program verify operation with multiple threshold values obtained by controlling on and off of the transistor. Referring to FIG. 9B, in step S21, the level of the memory cell designated by the row decoder and the column decoder in the sense amplifier 15 is compared with the first threshold value PV1.

In step S22, if the control circuit 2 determines that the level of the memory cell does not exceed the first threshold value PV1, the write circuit 17 drives the row decoder 4 and the column decoder 8 to perform the program operation for the memory cell in step S23. If the control circuit 2 determines that the level of the memory cell exceeds the first threshold value PV1, the level of the designated memory cell is compared with the second threshold value PV in step S24.

If the control circuit 2 determines that the level of the memory cell does not exceed the second threshold value PV (step S25), in step S26, the program operation is performed in a small unit, as shown in FIG. 9B, until the level of the memory cell designated by the write circuit 17 exceeds the second threshold value PV. In this manner, the write circuit 17 writes the data into the memory cell at different write levels before and after the write circuit 17 shifts the threshold value. If the level of the designated memory cell exceeds the second threshold value PV (step S25), the control circuit 2 completes the programming process.

In accordance with the second embodiment, the program verify operation uses two threshold values. For example, programming is performed with a given potential until the level of the memory cell exceeds the first threshold value PV1. Once the threshold value PV1 is exceeded, the reference level is changed to the second threshold value PV. Programming is performed little by little for convergence. This makes it possible to make the distribution of the programming voltage in the memory cell sharp in a short period of time.

Third Embodiment

Figure 10:
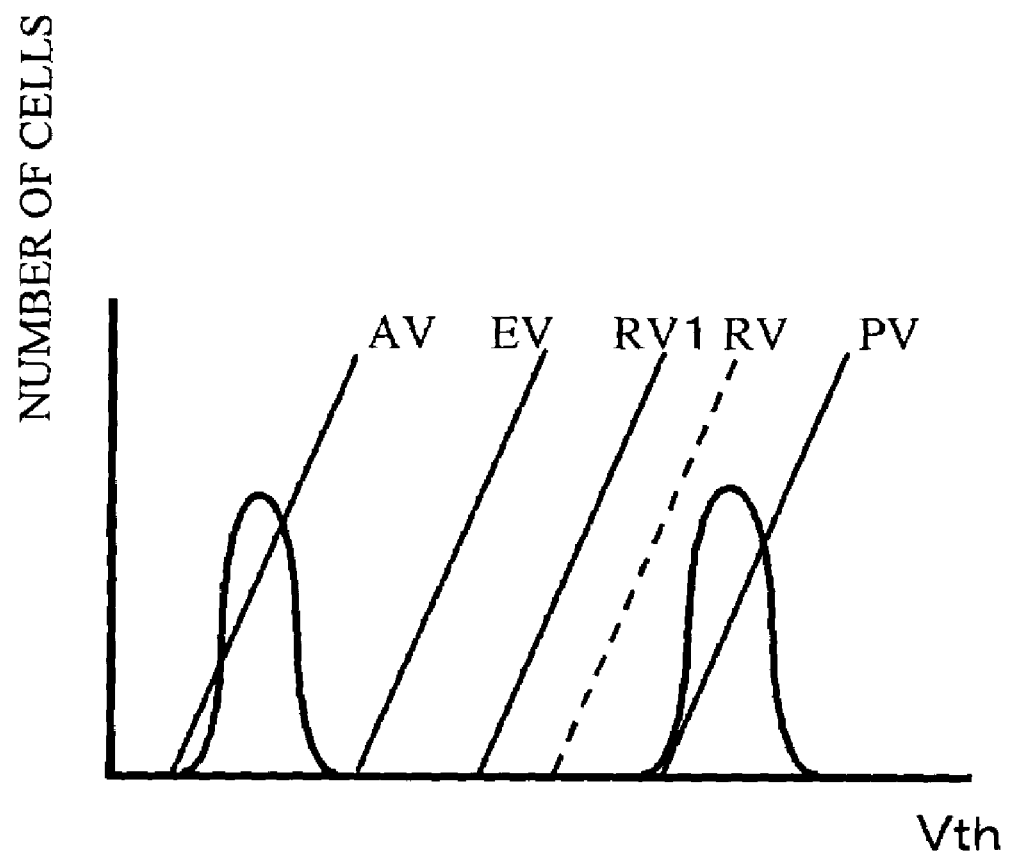
FIG. 10 is a view showing the threshold value of the reference circuit in accordance with a third embodiment.

Next, a description will be given of a third embodiment. In the third embodiment, the reference circuit 13 described in the first embodiment is applied to the reference circuit for read. FIG. 10 is a view showing the threshold value of the reference circuit in accordance with the third embodiment. In FIG. 10, the horizontal axis denotes the threshold value Vth, and the vertical axis denotes the number of the cells. "1" denotes the potential distribution of the memory cell in the erase state, and "0" denotes the potential distribution of the memory cell in the write state.

In the example shown in FIG. 10, the reference circuit 13 has two threshold values RV1 and RV of two types of the reference cells for read. RV is the first threshold value of the transistor used for read. RV1 is the second threshold value of the transistor used for read. AV, EV, and RV are same as those in the second embodiment, and a description is omitted, here.

As described in the first embodiment, the MOS transistor 134 is connected to the source of the transistor 131, and the transistor 137 is connected in parallel with the MOS transistor 134. By turning on and off the transistor 137 to shift the reference level, the first threshold value RV and the second threshold value RV1 are available for read with the use of one transistor.

Figure 11:
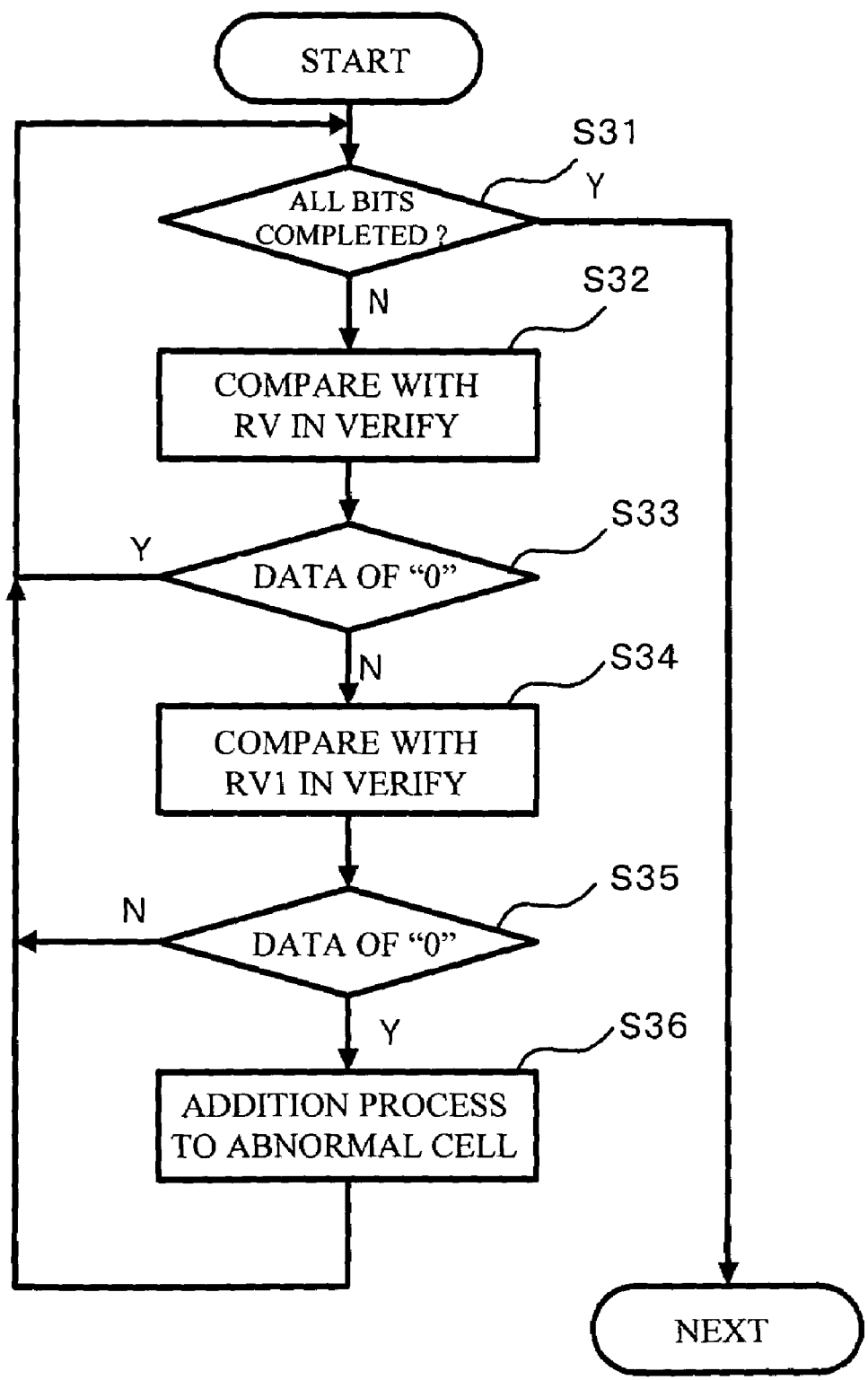
FIG. 11 is a flowchart of the process at the time of activation in accordance with the third embodiment.

FIG. 11 is a flowchart of the process at the time of activation in accordance with the third embodiment. FIG. 11 corresponds to FIG. 10. In step S31, all the bits are judged to have been checked. In step S32, if the all the bits are not checked, the level of the memory cell designated by the verify operation is compared with the first threshold value RV. In step S33, the level of the memory cell is checked whether it is "0", and if it is the data of "0", go back to step S31.

In step S33, if the level of the memory cell is not the data of "0", the data of "0" causes a charge loss, resulting in that data may be read as "1". In this case, in step S34, the threshold value RV is lowered by one level, and the memory level is compared with the second threshold value RV1 whether the memory level has the data of "0". In step S35, if the data in the memory cell is not the data of "0", go back to step S31. In step S35, if the data in the memory cell is the data of "0", perform additional process on an abnormal cell in step S36 and go back to step S31. The additional process includes, for example, additional program operation is performed, the data in the memory cell is stored and the program operation is performed later, and the like.

Conventionally, the electron is released from the floating gate that has been stored, resulting in a charge loss. This leads to a problem of system down. In accordance with the third embodiment, the control circuit 2 checks the level of the memory cell M with the use of multiple threshold values obtained by turning the transistor 137 on and off at the time of activation, enabling to find the abnormal cell in the initial stage. By carrying out an action such as performing additional program or providing redundancy, the malfunction of the device such as the system down can be prevented.

Here, the redundancy may be provided when the chip erase issues a sector erase command of the sector including the abnormal cell. After the erase, all the cells in the sectors including a redundant line become blank, eliminating a time loss for write the original data into the redundant line.

Figure 1A:
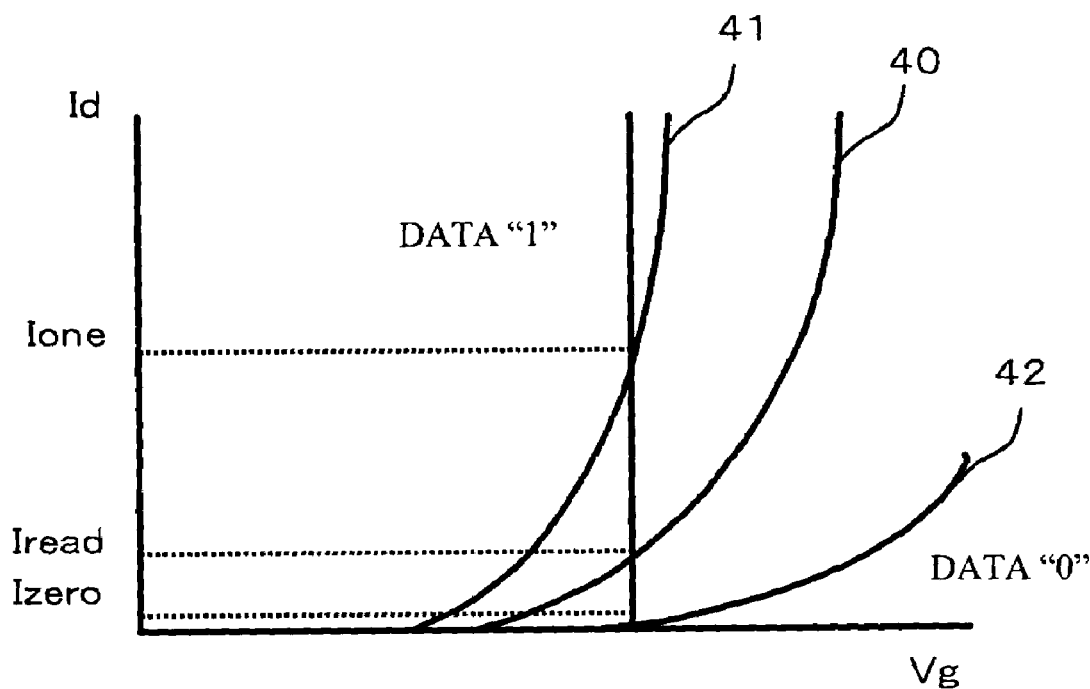
FIGS. 1A and 1B are views showing data judgment of a memory cell.
Figure 1B:
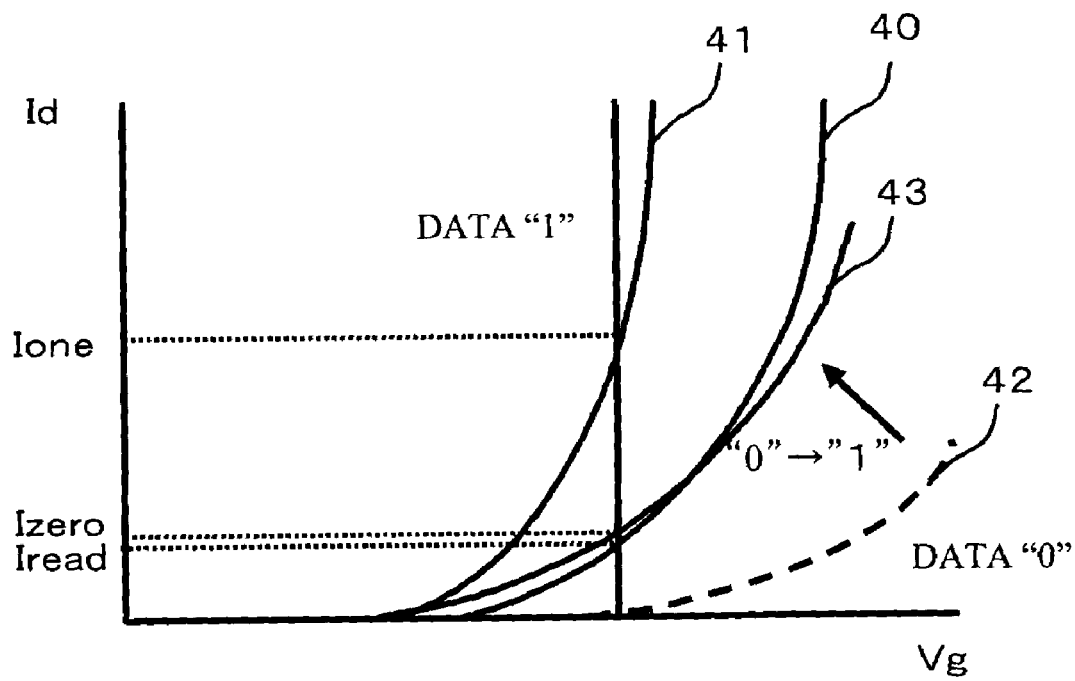
Figure 12:
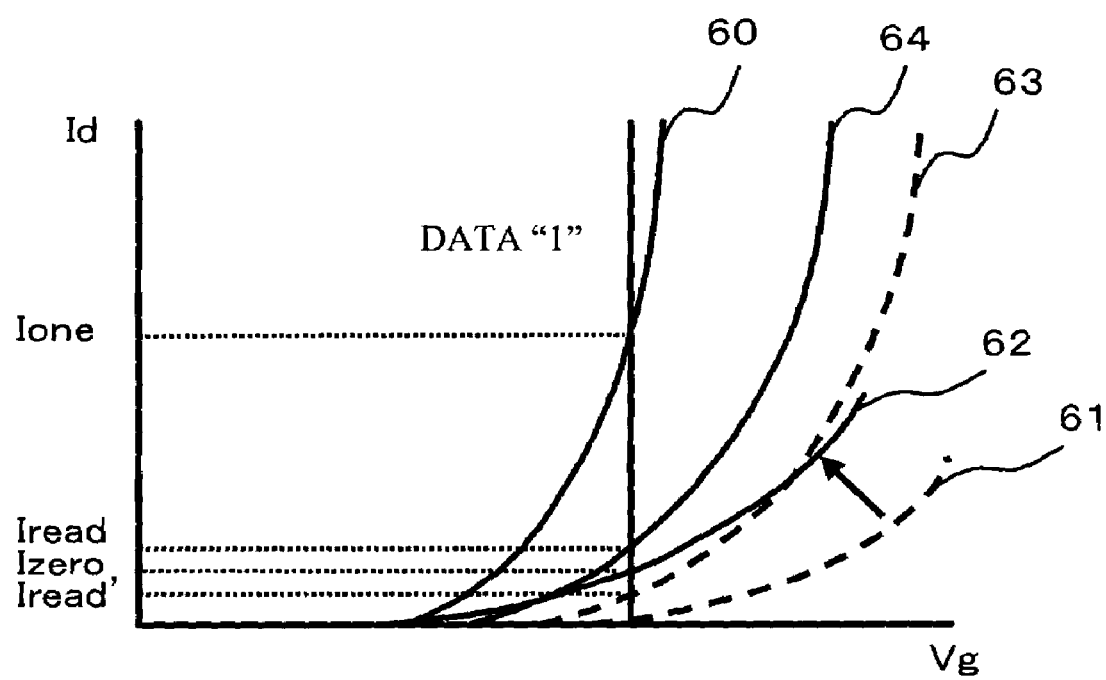
FIG. 12 is a view showing the data judgment of the memory cell in accordance with the third embodiment.

FIG. 12 is a view showing a data judgment of the memory cell of the present invention, in comparison with FIGS. 1A and 1B described in the conventional example. In FIG. 12, a Vg-Id characteristic curve 60 indicates the characteristic when erased, namely, the characteristic of the memory cell transistor storing the data 1. A Vg-Id characteristic curve 61 indicates the characteristic when normally programmed, namely, the characteristic of the memory cell transistor storing the data 0.

A Vg-Id characteristic curve 62 indicates the characteristic when the characteristic of the memory cell transistor stores the data 1. In this case, the threshold value Vth is lower than the normal time due to the deterioration with age. A Vg-Id characteristic curve 63 indicates the characteristic of the transistor composing the reference cell. Conventionally, if the Vg-Id characteristic curve 63 is used, Izero>Iread' is satisfied, resulting in that the data in the memory cell is misjudged to be the data of "1", although the data should be judged to be the data of "0".

A Vg-Id characteristic curve 64 indicates the characteristic of the transistor 131, after the transistor 137 is turned on and off to bypass the MOS diode 134. With the Vg-Id characteristic curve 64, Iread>Izero is satisfied. Even if the electron is released and the threshold value of the memory cell is lowered due to the deterioration with time, Iread is detected to have been exceeded before the data of "0" is misread as the data of "1". This exhibits that the data of "0" is almost damaged. This makes it possible to determine that the data in the memory cell is "1" properly.

Fourth Embodiment

A description will be given of a fourth embodiment. In the third embodiment, the present invention is applied to the activation process, yet the present invention is applied to events other than the activation process in the fourth embodiment. Generally, verifying and preprogramming are performed at the time of issuing the command of chip erase or sector erase. With this verification, the memory cell can be checked. In addition, other than those mentioned above, the memory cell may be checked at intervals in unoccupied time of the device, or may be checked just before getting into the sleep mode. In the fourth embodiment, the aforementioned processes are referred to as events, as will be described as follows.

Figure 13:
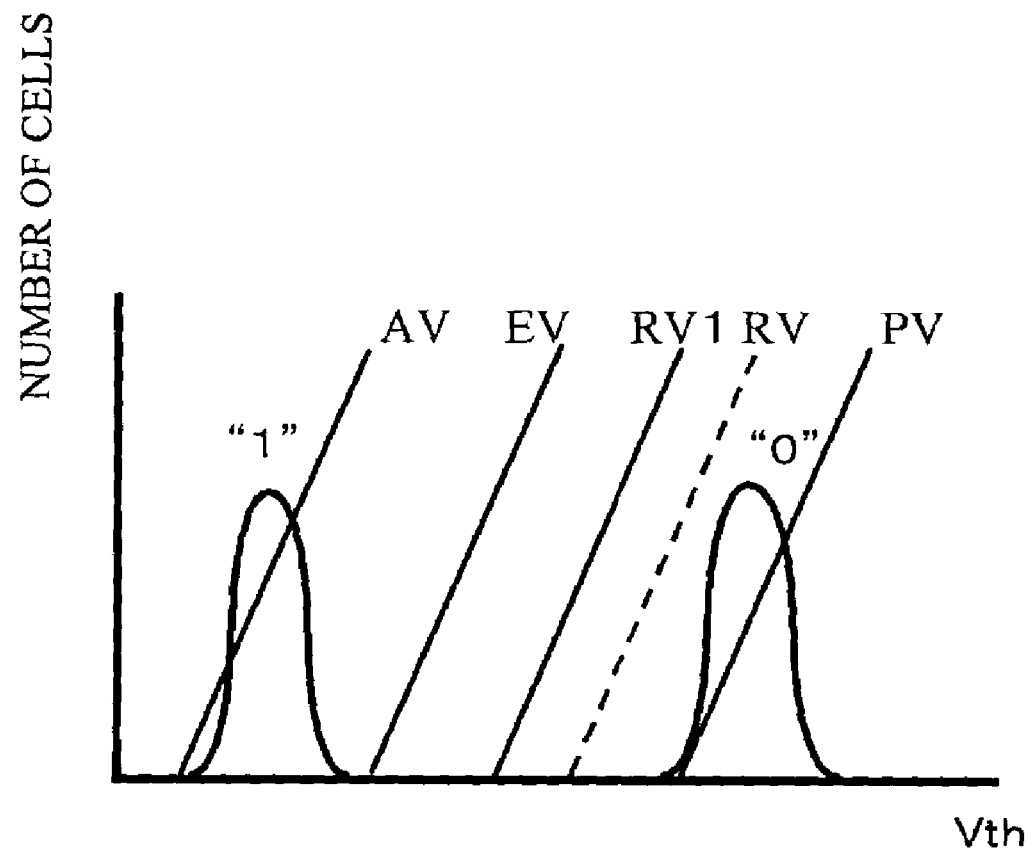
FIG. 13 is a view showing the reference level in accordance with a fourth embodiment.

FIG. 13 is a view showing the threshold level when the reference circuit 13 described in the first embodiment is applied to the reference circuit for read. In FIG. 13, the horizontal axis denotes the threshold value Vth, the vertical axis denotes the number of cells, "1" denotes the potential distribution of the memory cell in the erase state, and "0" denotes the potential distribution of the memory cell in the write state. RV denotes the first threshold value of the transistor used for read, and RV1 denotes the second threshold old value of the transistor used for read. AV, EV, and RV are same as those in the above-mentioned embodiments, and a description is omitted, here.

As described in the first embodiment, the MOS transistor 134 is connected to the source of the transistor 131, and the transistor 137 is connected in parallel with the MOS transistor 134. By turning on and off the transistor 137 to shift the reference level, the first threshold value RV and the second threshold value RV1 are available for read with one transistor.

Figure 14:
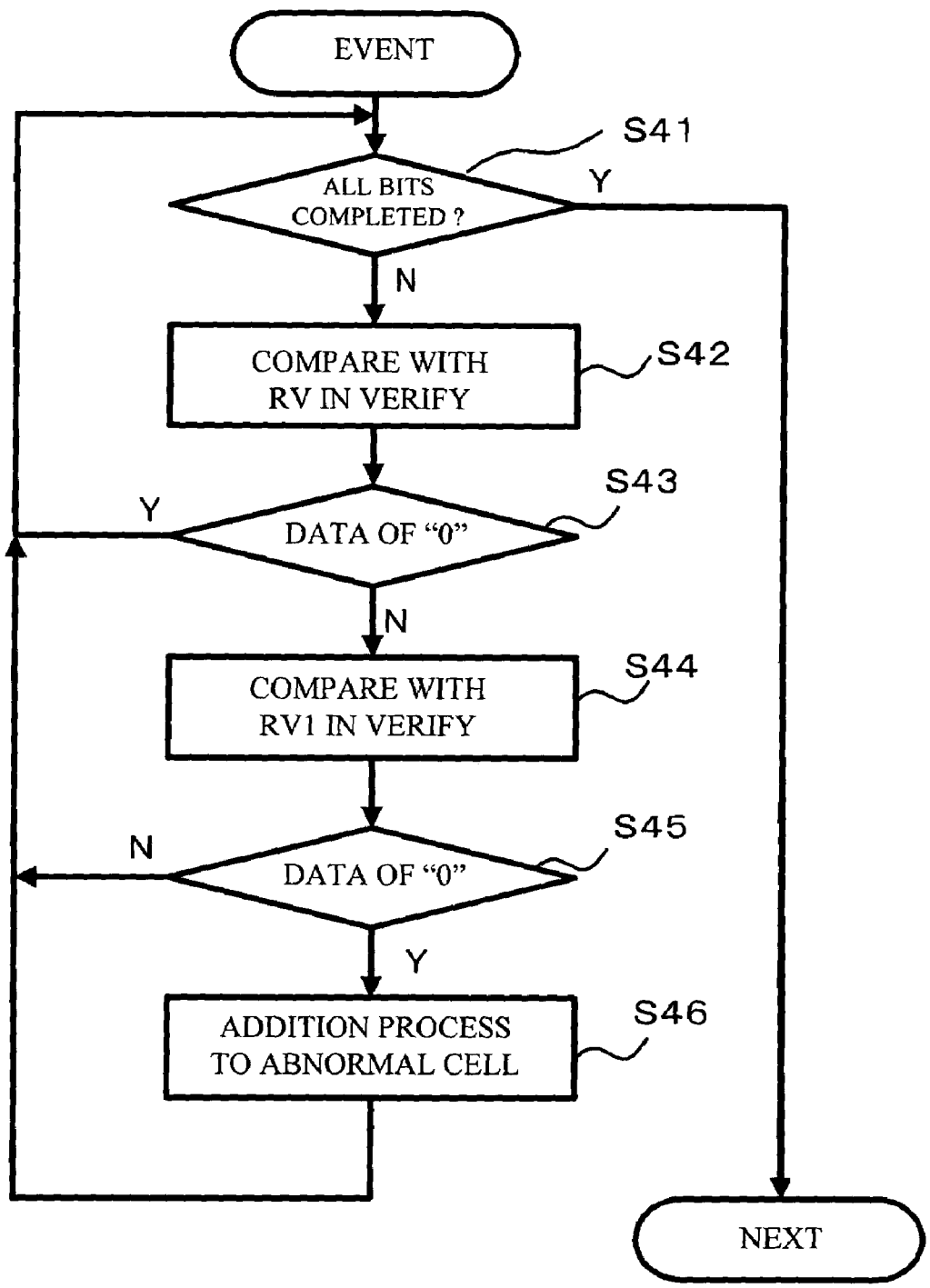
FIG. 14 is a flowchart at the time of the event in accordance with the fourth embodiment.

FIG. 14 is a flowchart at the time of the event. In step S41, all the bits are determined to have been checked. If all the bits are not checked in step S41, the level of the memory cell designated by the verify operation is compared with the first threshold value RV (step S42). The data in the memory cell is checked whether it is the data of "0" in step S43. If the data is "0", go back to step S41.

If the data is not "0" in step S43, the data of "0" may cause a charge loss and may be read as "1". In this case, the threshold value RV is decreased by one level, the level of the memory is compared with the second threshold value RV1 whether the level of the memory cell is the data of "0" in step S44. If the data of the memory cell is not the data of "0" instep S45, go back to step S41. If the data of the memory cell is the data of "0" in step S45, additional process is performed on the abnormal cell in step S46 and go back to step S41.

In accordance with the fourth embodiment, the verifying and preprogramming are performed at the time of issuing the command of chip erase or sector erase. The level of the memory cell is checked with the use of the verification, enabling an early detection of the abnormal cell to prevent the malfunction of the device such as the system down. In addition, the memory cell is checked at intervals in unoccupied time of the device or checked just before getting into the sleep mode, ensuring the prevention of the malfunction of the device such as the system down by early detection of the abnormal cell.

Fifth Embodiment

Figure 15A:
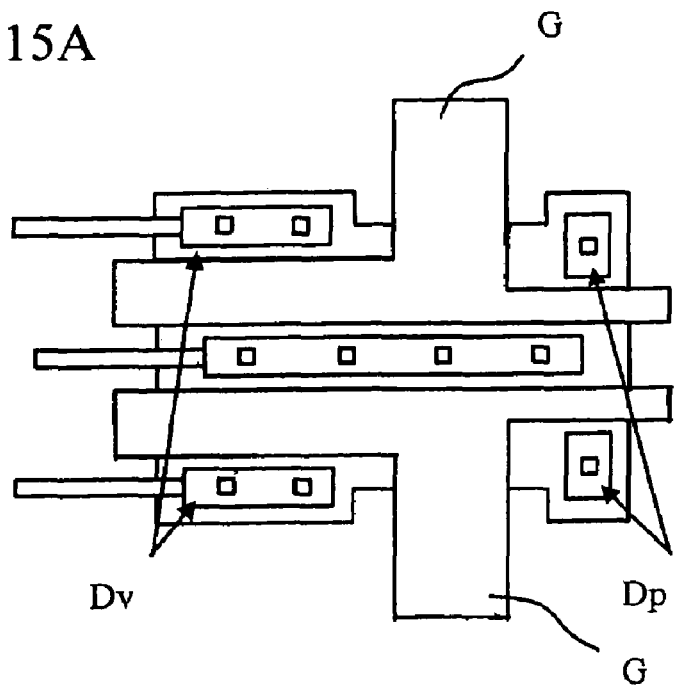
FIG. 15A is a layout on a conventional reference circuit.
Figure 15B:
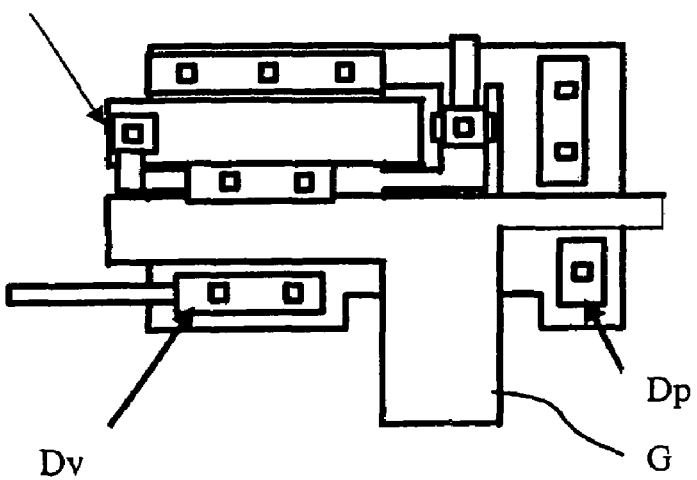
FIG. 15B is a layout on a semiconductor substrate in accordance a fifth embodiment.

A description will be given of a fifth embodiment. FIG. 15A is a layout on a conventional semiconductor substrate. FIG. 15B is a layout on a semiconductor substrate in accordance with the present invention. There are provided two transistors for reference on the semiconductor substrate in the conventional example shown in FIG. 15A. G denotes a gate of the transistor for reference, Dv denotes the drain for verifying, and Dp denotes the drain for programming.

In the present invention as shown in FIG. 15B, there are provided one transistor, the MOS diode 134 connected to the source of the reference cell transistor, and another transistor connected in parallel with the MOS diode 134 for bypassing the MOS diode. G denotes a gate of the transistor for reference, Dv denotes the drain for verifying, and Dp denotes the drain for programming.

As shown in FIG. 15A, conventionally, two transistors having two different threshold values have been demanded for two reference levels. This causes a problem in that the area on the semiconductor substrate is increased. The threshold value can be shifted with one transistor in accordance with the present invention, ensuring multiple reference levels with a smaller area.

Sixth Embodiment

Figure 16:
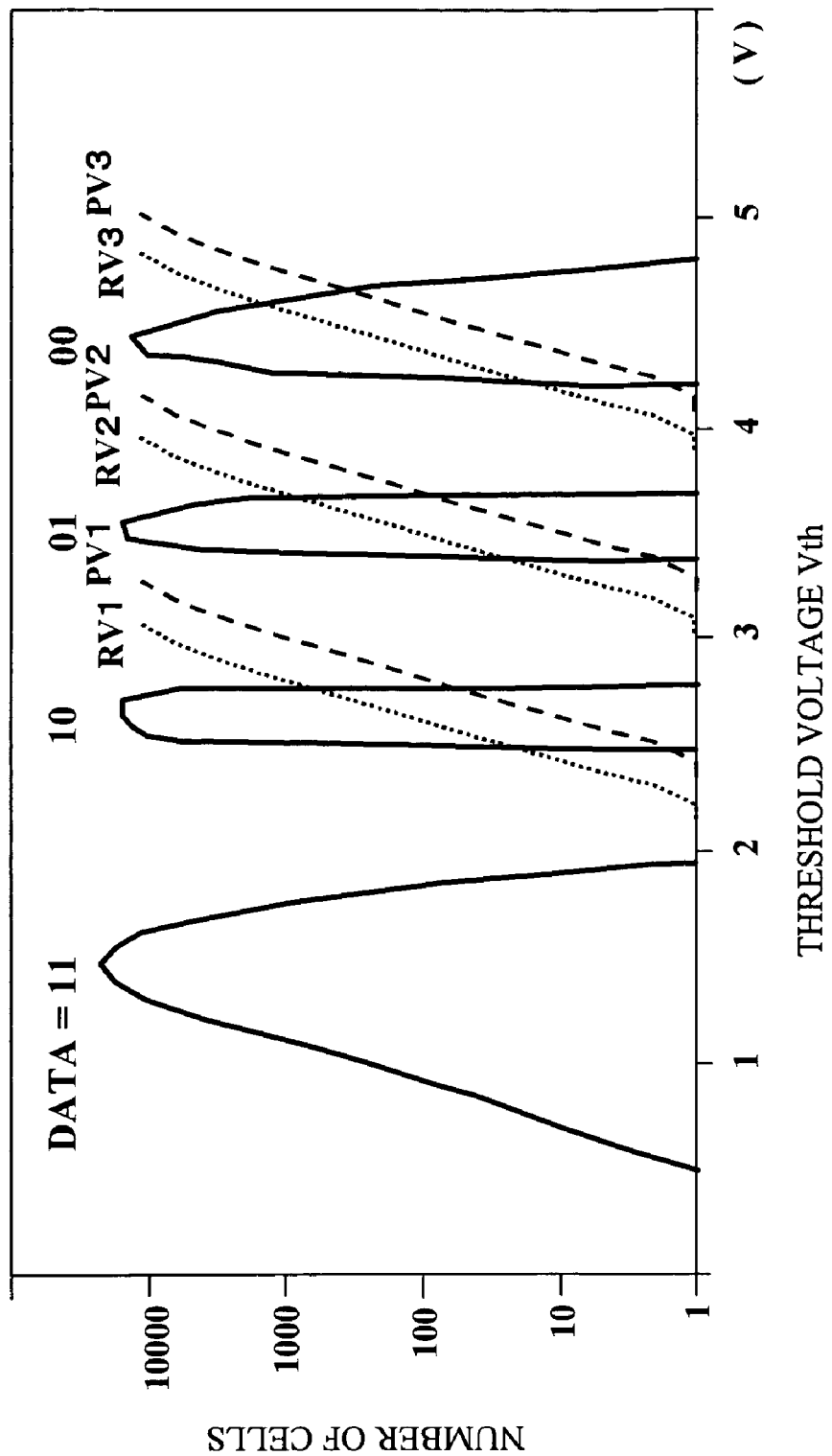
FIG. 16 shows the potential distribution of the reference level and the multi-level cells in a sixth embodiment.

Next, a description will be give of a sixth embodiment. In the sixth embodiment, a description will be given of an example in which the reference circuit described in the first embodiment is applied to the reference circuit for the multi-level memory cell having different threshold values. FIG. 16 shows the potential distribution of the reference level and the multi-level cells in the sixth embodiment. In FIG. 16, the horizontal axis denotes the threshold value, and the vertical axis denotes the number of the cells.

The threshold value of each memory cell is distributed to any one of a level 1, a level 2, a level 3, and a level 4, according to the programmed data. The level 1, the level 2, the level 3, and the level 4 respectively correspond to two bits of data of "11", "10", "01", and "00". RV1 denotes the threshold value of the reference cell for read in order to detect whether the memory cell has the level 1 or the level 2. PV1 denotes the program verify operation, and is the threshold value of the reference cell for program in order to detect whether the memory cell is programmed to the level 2 appropriately.

RV2 denotes the threshold value of the reference cell for read in order to detect whether the memory cell has the level 2 or the level 3. PV2 denotes the program verify operation, and is the threshold value of the reference cell for program in order to detect whether the memory cell is programmed to the level 3 appropriately. RV3 denotes the threshold value of the reference cell for read in order to detect whether the memory cell has the level 3 or the level 4. PV3 denotes the program verify operation, and is the threshold value of the reference cell for program in order to detect whether the memory cell is programmed to the level 4 appropriately. In the memory cell having multiple values, if 2 bits are used for the reference for read and the reference for program, one more bit is demanded for reference. In the conventional method, totally six reference cell circuits are demanded.

As described in the first embodiment, in the reference circuit 13, the MOS transistors 134 through 136 are respectively connected to the sources of the transistors 131 through 133, and the transistors 137 through 139 are connected in parallel with the MOS transistors 134 through 136. The reference level is shifted by turning on and off the transistor 137, ensuring six threshold values with the aforementioned three transistors. Therefore, in the present embodiment, only three reference circuits are demanded.

Seventh Embodiment

Figure 17:
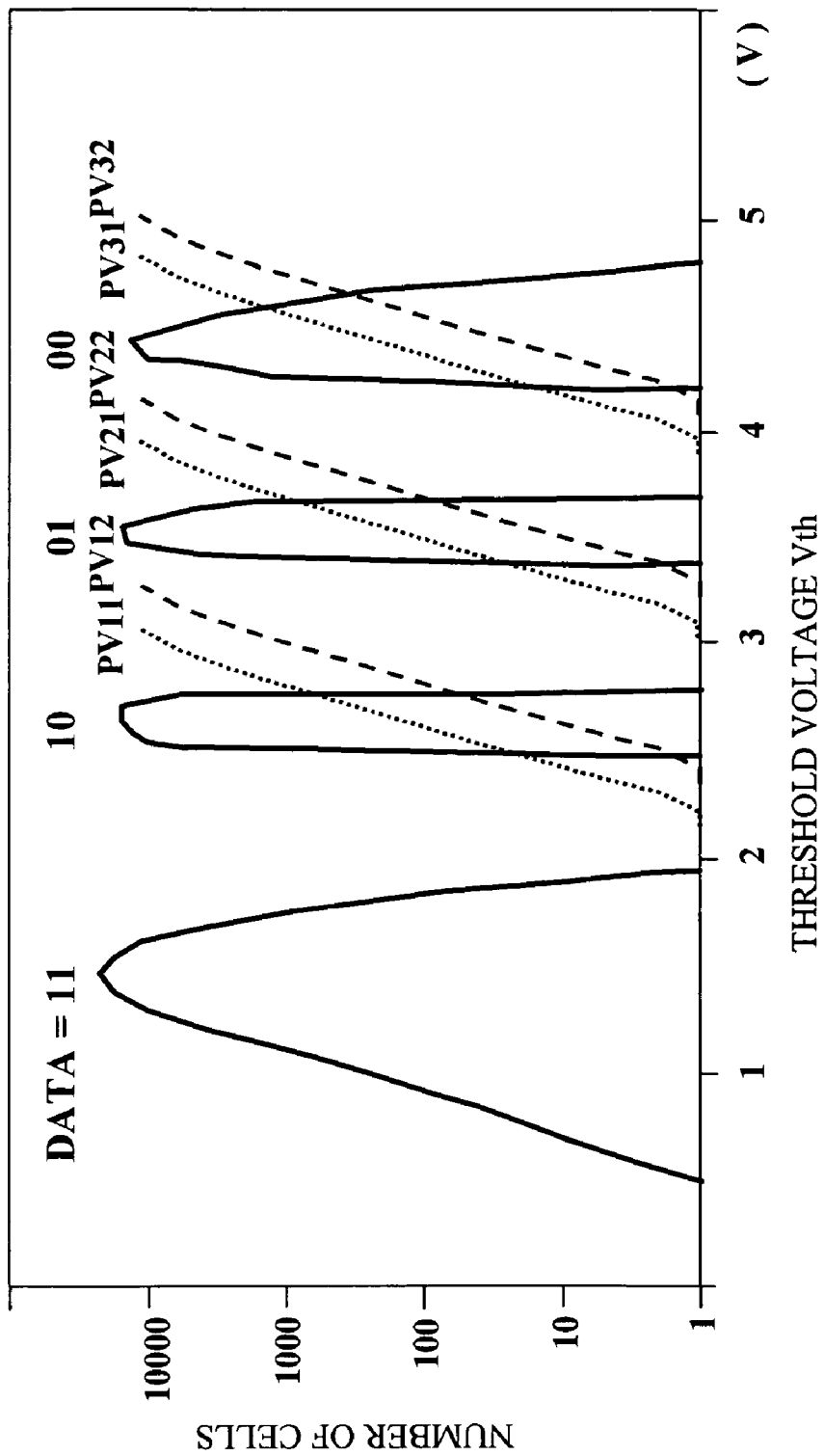
FIG. 17 shows the potential distribution of the reference level and the multi-level cell in accordance with a seventh embodiment.

Next, a description will be given of a seventh embodiment. In the seventh embodiment, the reference circuit described in the first embodiment is applied to the reference circuit for programming for the multi-level cell. FIG. 17 shows the potential distribution of the reference level and the multi-level cell in accordance with the seventh embodiment. In FIG. 17, the horizontal axis denotes the threshold value, and the vertical axis denotes the number of bits. PV11 denotes the threshold value (the first threshold value) of the reference cell for program in order to detect whether the memory cell is programmed to the level 2 appropriately in the program verify operation. PV12 denotes the threshold value (the second threshold value) of the reference cell for program.

PV21 denotes the threshold value (the first threshold value) of the reference cell for program in order to detect whether the memory cell is programmed to the level 3 appropriately in the program verify operation. PV22 denotes the threshold value (the second threshold value) of the reference cell for program. PV31 denotes the threshold value (the first threshold value) of the reference cell for program in order to detect whether the memory cell is programmed to the level 4 appropriately in the program verify operation. PV32 denotes the threshold value (the second threshold value) of the reference cell for program.

As described in the first embodiment, in the reference circuit 13, the MOS transistors 134 through 136 are respectively connected to the sources of the transistors 131 through 133, and the transistors 137 through 139 are connected in parallel with the MOS transistors 134 through 136. The reference level is shifted by turning on and off the transistor 137, ensuring six threshold values with the aforementioned three transistors.

With the threshold value for two types of the program verification, the programming is normally performed at the time of programming until the first threshold values PV11, PV21, and PV31 are exceeded. After the threshold values PV11, PV21, and PV31 are exceeded, the reference level is changed to the second threshold values PV1, PV2, and PV3. Programming is performed little by little for convergence, the Vth distribution can be made sharp easily in a short period. The multiple memory cells having 2-bit data in the memory cell need one more bit for reference. Therefore, totally six reference cells are needed in the conventional method, yet in the present embodiment, only three reference circuits are demanded.

Eighth Embodiment

Figure 18:
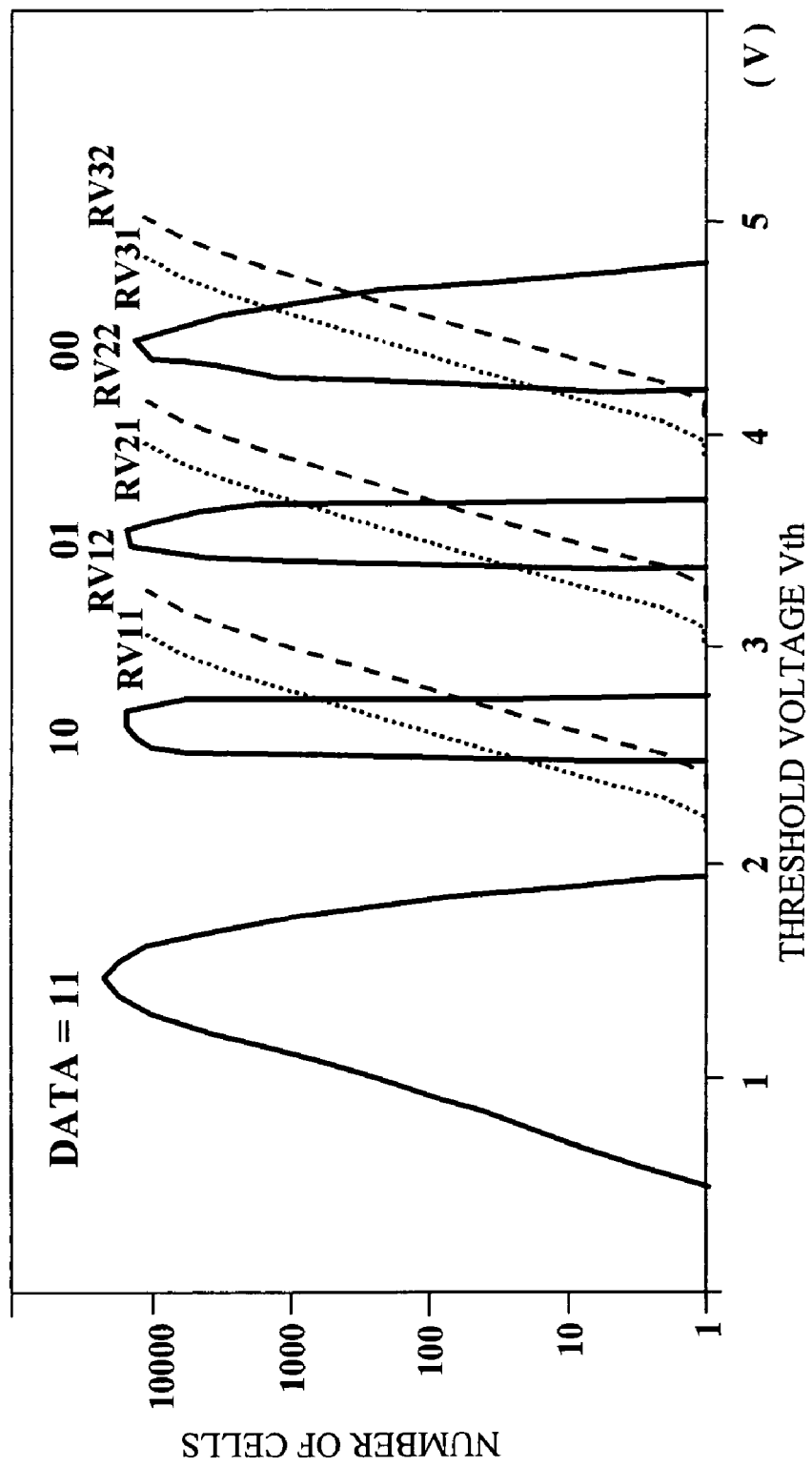
FIG. 18 is a view showing the potential distribution of the reference cell level and the multi-level cell in accordance with an eighth embodiment.

Next, a description will be given of an eighth embodiment. In the eighth embodiment, the reference circuit described in the first embodiment is applied to the reference circuit for the multi-level cell. FIG. 18 is a view showing the potential distribution of the reference cell level and the multi-level cell in accordance with the eighth embodiment. In FIG. 18, the horizontal axis denotes the threshold value, and the vertical axis denotes the number of bits. RV11 denotes the threshold value (the first threshold value) of the reference cell for read in order to detect whether the memory cell has the level 1 or level 2. RV12 denotes the threshold value (the second threshold value) of the reference cell for read in order to detect whether the memory cell has the level 1 or level 2.

RV21 denotes the threshold value (the first threshold value) of the reference cell for read in order to detect whether the memory cell has the level 2 or level 3. RV22 denotes the threshold value (the second threshold value) of the reference cell for read in order to detect whether the memory cell has the level 2 or level 3. RV31 denotes the threshold value (the first threshold value) of the reference cell for read in order to detect whether the memory cell has the level 3 or level 4. RV32 denotes the threshold value (the second threshold value) of the reference cell for read in order to detect whether the memory cell has the level 3 or level 4.

As described in the first embodiment, in the reference circuit 13, the MOS transistors 134 through 136 are respectively connected to the sources of the transistors 131 through 133, and the transistors 137 through 139 are connected in parallel with the MOS transistors 134 through 136. The reference level is shifted by turning on and off the transistor 137, ensuring six threshold values with the aforementioned three transistors.

Two types of the threshold values for read allows to detect the lowered Vth due to the charge loss, by checking "11", "10", "01", and "00" in memory checking at the time of activation with the use of the second threshold values RV12, RV22, and RV32, which are higher than the first threshold values RV11, RV21, and RV31. This ensures the detection of the abnormal cell in the initial stage. By carrying out an action such as performing additional programming or providing redundancy, the malfunction of the device such as the system down can be prevented.

In the memory cell having multiple values, if 2 bits are can be stored in the memory cell, one more bit is demanded for reference. If there are six threshold values, six reference cells are conventionally demanded. In accordance with the present invention, one reference cell has two threshold values, resulting in that only three reference cells are demanded. This makes it possible to provide the semiconductor device having multiple reference levels with a smaller area.

In accordance with the embodiments as described above, the guard band is obtainable in a normal trimming period as to the normal reference level. The reference levels are used for not only reading but also programming. The characteristic of the flash memory can be improved in an actual use state. With the multiple reference currents (reference levels) generating capabilities, screening/prevention of the defective flash memory can be performed effectively. Multiple reference levels can be generated with a simple circuit configuration and circuit area.

Although a few preferred embodiments of the present invention have been shown and described, it would be appreciated by those skilled in the art that changes may be made in these embodiments without departing from the principles and spirit of the invention, the scope of which is defined in the claims and their equivalents. For example, in the above-mentioned embodiments, two threshold values are provided for one reference cell in the above-mentioned embodiments, however, the present invention is not limited to this, and one reference transistor may be configured to have multiple thresholds values.

What is claimed is:

1. A semiconductor device comprising:
   an array of memory cells;
   a reference circuit determining a reference level by using a reference cell; and
   a comparator circuit comparing data of the memory cells with the reference level,
   the reference circuit comprising a circuit part that is connected to the reference cell and shifts the reference level from a first reference level to a second reference level, wherein the circuit part includes a diode connected to a source of the reference cell, the circuit part further including a switch transistor that is connected in parallel with the diode and is turned on/off, further comprising a control circuit that controls the switch transistor, wherein the control circuit performs a verify operation on the memory cells by using reference levels produced by turning the switch transistor on/off.

2. The semiconductor device as claimed in claim 1, further comprising a write circuit that writes data into the memory cells, wherein the write circuit uses different writing levels before and after the reference level is shifted.

3. The semiconductor device as claimed in claim 1, wherein each of the memory cells has different threshold values.

4. The semiconductor device as claimed in claim 1, wherein the memory cells include floating-gate type transistors.

5. The semiconductor device as claimed in claim 1, wherein the semiconductor device is a semiconductor memory device.

6. A semiconductor device comprising:
   an array of memory cells;
   a reference circuit determining a reference level by using a reference cell; and
   a comparator circuit comparing data of the memory cells with the reference level,
   the reference circuit comprising a circuit part that is connected to the reference cell and shifts the reference level from a first reference level to a second reference level, wherein the circuit part includes a diode connected to a source of the reference cell, the circuit part further including a switch transistor that is connected in parallel with the diode and is turned on/off, further comprising a control circuit that controls the switch transistor, wherein the control circuit checks levels of the memory cells using reference levels obtained by turning the switch transistor on/off.

7. The semiconductor device as claimed in claim 6, wherein the control circuit checks the levels of the memory cells using reference levels obtained by turning the switch transistor on/off when the semiconductor device is activated.

8. A method of writing data in a memory cell comprising the steps of:
   changing a reference level by controlling an on/off operation on a transistor connected in parallel with a diode, the diode connected in series with a reference cell; and
   writing data into the memory cell with different reference levels before and after the reference level is changed.

* * * * *